(12) United States Patent
Atkinson

(10) Patent No.: US 6,243,569 B1
(45) Date of Patent: Jun. 5, 2001

(54) DIRECT CONVERSION CIRCUIT FOR RADIO FREQUENCY SIGNALS

(75) Inventor: Simon Atkinson, Heatfield (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/133,781

(22) Filed: Aug. 12, 1998

(51) Int. Cl.[7] .................................................. H04B 1/26
(52) U.S. Cl. ......................... 455/324; 455/260; 455/310
(58) Field of Search ..................................... 455/324, 260, 455/264, 318, 310, 313, 130, 131, 63, 67.3

(56) References Cited

U.S. PATENT DOCUMENTS

| | | |
|---|---|---|
| 4,811,425 | 3/1989 | Feerst . |
| 5,003,621 * | 3/1991 | Gailus ................................... 455/324 |
| 5,303,417 | 4/1994 | Laws . |
| 5,339,040 | 8/1994 | Loper . |
| 5,428,837 | 6/1995 | Bayruns et al. . |
| 5,438,692 | 8/1995 | Mohindra . |
| 5,530,929 * | 6/1996 | Lindqvist et al. ..................... 455/324 |
| 5,584,059 | 12/1996 | Turney et al. . |
| 5,584,068 | 12/1996 | Mohindra . |
| 5,606,731 * | 2/1997 | Pace et al. ............................ 455/260 |
| 5,822,688 * | 10/1998 | Eul ....................................... 455/324 |
| 5,826,180 * | 3/1991 | Golan ................................... 455/324 |
| 5,903,196 | 5/1999 | Salvi et al. . |
| 5,949,830 | 9/1999 | Nakanishi . |
| 5,973,570 * | 10/1999 | Salvi et al. ............................ 455/260 |
| 5,983,081 * | 11/1999 | Lehtinen .............................. 455/260 |
| 5,983,088 | 11/1999 | Aschwanden . |
| 6,052,571 * | 6/1996 | Mishima et al. ..................... 455/260 |

FOREIGN PATENT DOCUMENTS

| | | |
|---|---|---|
| 2 340 687 | 2/2000 | (GB) . |
| 61-273005 | 12/1986 | (JP) . |
| 7-245568 | 9/1995 | (JP) . |
| 9-172465 | 6/1997 | (JP) . |
| WO 96/38924 | 12/1996 | (WO) . |

OTHER PUBLICATIONS

[http://www.analog.com/publications/whitepapers/products/AD9042.html.], Universal Basestation/Wideband Receivers Background Information [AD9042], 1995.

Brannon, Brad, [http://www.analog.com/publications/magazines/Dialogue/29–2/wdbndradios.html.], Wideband Radios Need Wide Dynamic Range Converters, 1995.

* cited by examiner

*Primary Examiner*—Dwayne Bost
*Assistant Examiner*—Quochien B. Vuong
(74) *Attorney, Agent, or Firm*—Samuels, Gauthier & Stevens

(57) ABSTRACT

A direct conversion circuit for radio frequency signals is disclosed. The circuit includes a pair of quadrature related mixers, a phase shift unit, and a local oscillator. The pair of quadrature related mixers is coupled to a radio frequency signal input port for mixing down a radio frequency input signal. The phase shift unit is in communication with at least one of the pair of mixers for phase shifting a local oscillator signal. The local oscillator produces the local oscillator signal. The local oscillator includes a non-integer frequency multiplier for multiplying the frequency of a first voltage controlled oscillator signal by a non-integer value to produce the local oscillator signal.

20 Claims, 1 Drawing Sheet

DIRECT CONVERSION CIRCUIT FOR RADIO FREQUENCY SIGNALS

BACKGROUND OF THE INVENTION

The present invention generally relates to receivers and transmitters for radio frequency (RF) signals, and particularly relates to direct conversion receivers.

Unlike a superheterodyne receiver, which converts an input RF signal to an intermediate frequency, a direct conversion receiver does not convert the input RF signal to an intermediate frequency. A direct conversion receiver mixes directly to a direct current (DC) signal, and is sometimes referred to as a zero IF receiver because the intermediate frequency is zero hertz (DC). The modulation information only is represented in the down conversion, and there is no carrier information that is typically associated with an intermediate frequency. In a direct conversion receiver the local oscillator signal is operating at the same frequency as the input RF signal. U.S. Pat. Nos. 5,438,692 and 5,548,068 disclose conventional direct conversion receivers.

In direct conversion, the modulation information is preserved through quadrature down conversion, which involves mixing the incoming line or carrier with a local oscillator signal along two different paths. The local oscillator signal along one path may be at zero phase (0°) with respect to the input RF signal, and may be phase shifted to 90° along the other path. Alternatively, one path may be at −45° while the other is at +45° with respect to the input signal. See for example, U.S. Pat. No. 5,303,417. In any event, the circuit paths are typically mutually 90° different in phase, and one path is referred to as the I channel while the other is referred to as the Q channel. The quadrature down conversion method preserves the necessary phase information within the input signal.

As shown in FIG. 1, a direct conversion circuit of the prior art includes an input port 10 for receiving an input RF signal from an RF antenna. The input signal is divided between two input paths. The input signal in one input path is mixed at mixer 12 with the local oscillator signal 14 at zero degrees phase shift. The input signal in the other input path is mixed at mixer 16 with the local oscillator signal at 90° phase shift. The 90° phase shift in the local oscillator signal is achieved by phase shift device 20. The local oscillator signal is produced in the illustrated conventional local oscillator circuit by first mixing two signals from voltage controlled oscillators (VCOs) 22 and 24 at mixer 26. The VCOs 22 and 24 may or may not be integrated in the same integrated circuit (IC) as the mixers 12 and 16. The signal is then filtered at bandpass filter 28 to produce the local oscillator signal 14. The bandpass filter 28 is typically not integrated on the same IC as indicated by the dashed line 29. The frequency of the local oscillator signal 14 is the same as the frequency of the input RF signal at input port 10.

Interference may occur if the local oscillator signal radiates to the input RF signal. Because the frequencies of these signals are the same, the local oscillator signal cannot be frequency filtered from the incoming signal. The incoming signal would, in effect, be blocked. U.S. Pat. Nos. 4,811,425 and 5,428,837 are directed to reducing the effects of leakage of local oscillator signals to RF input signals in zero IF receivers.

Moreover, interference may occur if the RF input signal radiates to the VCO. Since VCOs are typically very sensitive, any signal that is close in frequency to the frequency of the VCO may interact with it, even if the signal comprises only a small amount of energy. This is because the VCO will selectively amplify signals at or near its frequency, causing a low energy noise signal at or near its frequency to appear to be a spectrally clean signal.

One way of overcoming this problem is to employ a VCO that operates at a frequency different than the input RF signal. The frequency of the VCO signal is then modified to produce a local oscillator signal at the same frequency as the input RF signal. For example, as shown in FIG. 1, the signal from one VCO 22 (at frequency $F_1$) may be combined with the signal from another VCO 24 (at frequency $F_2$) by mixer 26. The combined signal may then be filtered by a bandpass filter 28 to produce a local oscillator signal 14. The product, however, of the $F_1$ and $F_2$ signals, will include spurious signals that must be filtered out to produce the local oscillator signal. For example, the product of two sine functions $\sin(\alpha) \times \sin(\beta)$ equals $\frac{1}{2}\cos(\alpha-\beta) - \frac{1}{2}\cos(\alpha+\beta)$. Two frequencies would be produced at the mixer ($F_1+F_2$ and $F_1-F_2$), and one would have to be filtered out. It is typically necessary to do this type of filtering off IC, which further invites interference or leakage of the local oscillator signal to the input RF signal.

In other conventional local oscillator circuits, one VCO only might be employed and the output of the VCO would be input to a frequency doubler, then to a bandpass filter, and finally to the phase shift device 20. The frequency of the VCO ($F_1$) could be one half the frequency of the RF input signal, and the frequency of the local oscillator would then be $2F_1$. In further conventional local oscillator circuits, the frequency of the VCO ($F_1$) could be twice the frequency of the RF input signal, and the frequency of the local oscillator signal may be equal to $\frac{1}{2}F_1$. This could also be achieved with one VCO ($F_1$), whose output could be input to a one-half frequency divider to produce the local oscillator signal for input to the phase shift device 20. In each such circuit however, the local oscillator signal may still radiate to the RF input signal, and the VCO may be sensitive to harmonic frequencies of the RF input signal.

Such conventional techniques do not fully alleviate the interference problems. It is an object of the present invention to provide a direction conversion receiver or transmitter that has reduced leakage or interference between the radio frequency input signal and the local oscillator.

SUMMARY OF THE INVENTION

A direct conversion circuit for radio frequency signals is disclosed. The circuit includes a pair of quadrature related mixers, a phase shift unit, and a local oscillator. The pair of quadrature related mixers is coupled to a radio frequency signal input port for mixing down a radio frequency input signal. The phase shift unit is in communication with at least one of the pair of mixers for phase shifting a local oscillator signal. The local oscillator produces the local oscillator signal. The local oscillator includes a non-integer frequency multiplier for multiplying the frequency of a first voltage controlled oscillator signal by a non-integer value to produce the local oscillator signal.

In certain embodiments of the invention, the circuit includes a phase locked loop including a reference path and a feedback path. The phase locked loop may include a frequency divider in the reference path, a frequency divider in the feedback path, and a second voltage controlled oscillator in the feedback path.

BRIEF DESCRIPTION OF THE DRAWINGS

The following detailed description of the illustrated embodiments may be further understood with reference to the accompanying drawings in which.

DETAILED DESCRIPTION OF THE ILLUSTRATED EMBODIMENTS

Figure 1:
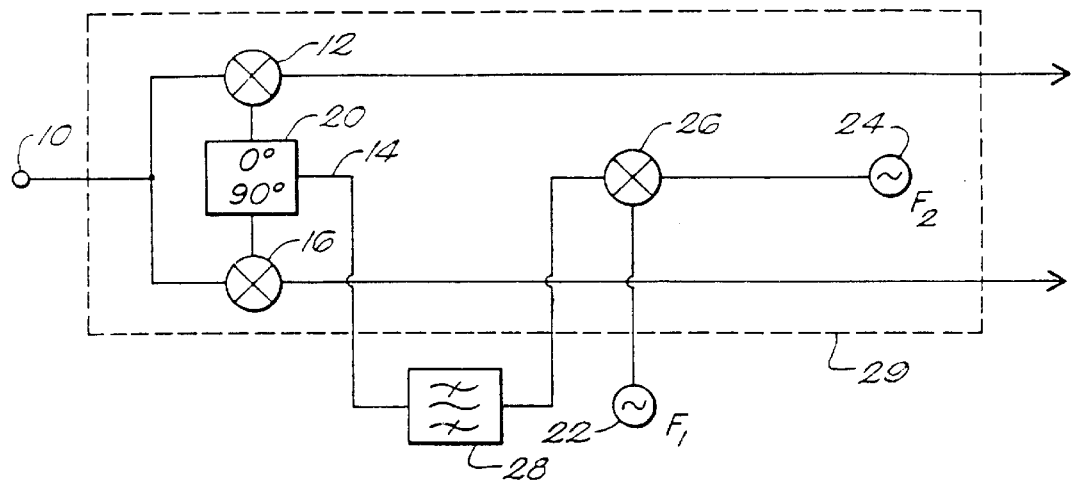
FIG. 1 shows a schematic representation of a prior art direct conversion circuit.
Figure 2:
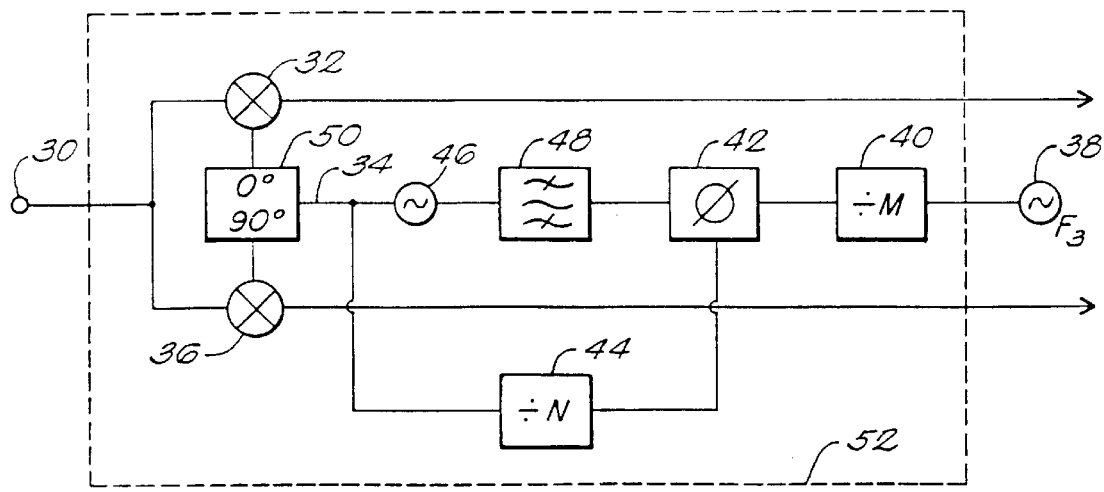
FIG. 2 shows a schematic representation of a direct conversion circuit of the invention.

As shown in FIG. 2, a direct conversion circuit of the invention includes an input port 30 for receiving an input RF signal from a radio frequency signal antenna. The input signal is divided between two channels, one of which is mixed at mixer 32 with a local oscillator signal 34 at zero degrees phase shift, and the other of which is mixed at mixer 36 with the local oscillator signal at 90°.

The local oscillator signal 34 is generated by a phase locked loop as follows. In the reference path, a first signal having a frequency $F_3$ is generated by first voltage controlled oscillator 38. The first signal is input to a frequency divider 40 ($\div M$), the output of which is input to a first input of a phase-sensitive detector 42 of a phase locked loop. The output of the detector 42 is fed back through another frequency divider 44 ($\div N$), a second voltage controlled oscillator 46, then and a bandpass filter 48. The output of the bandpass filter 48 is then input to the second input of the detector 42. The local oscillator signal 34 is provided to the phase shift device 50 by the output of the divider 44.

If, for example, the frequency of the input signal at port 30 is 1.8 GHz, then the VCO 38 frequency could be selected to be 1.35 GHz, where the value M of the divider 40 is selected to be 3 and the value N of the divider 44 is selected to be 4. The frequency of the second oscillator 46 would be selected to be 1.8 GHz in this example. Since the divider 40 is in the reference path, it multiplies the frequency of $F_3$ by 1/M. Since the divider 44 is in the feedback path, it multiplies the frequency of the phase locked loop signal by N. The frequency, therefore, of the local oscillator signal 34 will be $(N/M) \times F_3 = 4/3 \times 1.35$ GHz=1.8 GHz, which is the same as the frequency of the input RF signal.

The frequency $F_3$ of the signal from the voltage controlled oscillator 38 in this example is not harmonically related, therefore, to the frequency of the input RF signal. This is because the frequency of the input RF signal is equal to $4/3F_3$. Any coupling of the input RF signal to the VCO 36, therefore, should have a minimal effect on the operation of the VCO 36.

The second oscillator is also-protected from interference since it forms part of the phase locked loop. The phase locked loop causes the VCO 46 to track the reference frequency from the VCO 38. If the VCO 38 is spectrally clean, then it is not required that the second VCO 46 be spectrally clean. This permits the second oscillator 46 to be fully integrated on the same integrated circuit as the mixers 32 and 36. Typically, VCOs that are integrated on a single IC tend to be noisy. Because the feedback loop will strip any noise off of the VCO 46, superior isolation may then be achieved than would be possible by having the VCO 46 not integrated. The VCO 38 need not be integrated on the same IC as the mixers 32 and 36.

Additionally, the phase locked loop in a circuit of the invention has a wide operating bandwidth. If the frequency $F_3$ of the VCO 38 rapidly changes during operation, the phase locked loop will track it. The entire loop is, in effect, a voltage controlled oscillator in which the sensitivity to interaction from the RF signal is removed. Specifically, if interference from the input RF signal reaches the VCO 46, it will try to transfer modulation to it. The phase locked loop will compare this signal to the reference signal, and apply inverse compensation to ensure that it remains clean. So, even if spurious energy signals interact with the VCO 46, the phase locked loop will strip them off.

The voltage controlled oscillator is offset, but the local oscillator signal is generated by a non-integer multiplication or division using a phase locked loop. By employing a wideband phase locked loop as discussed above, the phase of the loop will track that of the incoming voltage controlled oscillator over a wide bandwidth. As such, if the phase locked loop bandwidth is more wide than the RF filter in the return path then the free running phase noise requirements of the voltage controlled oscillator within the loop become sufficiently trivial that the oscillator may be completely integrated on one integrated circuit chip. By keeping the phase locked loop circuitry entirely on-chip, the coupling of the local oscillator signal to the input RF signal is greatly reduced (due to elimination of cross—package radiation). The resultant DC offset at the mixer output is also reduced.

Other benefits of circuits of the invention are that the comparison frequency in the phase locked loop phase detector occurs at a very high frequency, e.g., greater than the loop bandwidth. The integration properties of the voltage controlled oscillator and the loop filter, therefore, ensure that the resultant local oscillator signal contains low levels only (if any) of spurious sidebands. Additionally, through careful selection of the reference and loop divide ratios, it is possible to use a single reference oscillator to cover multi-band applications. This is because switching the dividers allows the phase locked loop to switch from being a non-integer divider to a non-integer multiplier.

The above description relates to employing circuits of the invention to provide direct conversion receivers for radio frequency signals. Circuits of the invention may also be employed to provide direct conversion transmitters as well by directing the I and Q channel signals into the mixers, the outputs of which are combined and delivered to a transmitting antenna.

Those skilled in the art will appreciate that modifications and variations may be made to the above disclosed embodiments without departing from the spirit and scope of the invention.

What is claimed is:

1. A direct conversion circuit for radio frequency signals, said circuit comprising:

a pair of quadrature related mixers coupled to a radio frequency signal input port for mixing down radio frequency input signals residing within a first bandwidth;

phase shift means in communication with at least one of said pair of mixers for phase shifting a local oscillator signal; and a local oscillator for producing said local oscillator signal, said local oscillator including non-integer frequency multiplier means for multiplying the frequency of a first voltage controlled oscillator signal by a first non-integer value to produce said local oscillator signal, said non-integer frequency multiplier means including a phase locked loop having a second bandwidth that is at least as large as the first bandwidth.

2. A direct conversion circuit as claimed in claim 1, wherein said phase locked loop includes a reference path, a feedback path, and a frequency divider device in at least one of said reference and feedback paths.

3. A direct conversion circuit as claimed in claim 1, wherein said phase locked loop includes a reference path, a feedback path, and a frequency divider in each of said reference and feedback paths.

4. A direct conversion circuit as claimed in claim 1, wherein said phase locked loop includes a second voltage controlled oscillator in a feedback path of said phase locked loop.

5. A direct conversion circuit as claimed in claim 1, wherein said local oscillator further includes a second voltage controlled oscillator on the same integrated circuit as said pair of quadrature mixers.

6. A direct conversion circuit as claimed in claim 1, wherein said local oscillator includes a second voltage controlled oscillator in a feedback path of said phase locked loop, said phase locked loop for removing spurious signals from said voltage controlled oscillator.

7. A direct conversion circuit as claimed in claim 1, wherein said local oscillator includes a phase sensitive detector that includes two input ports and an output port, one of said input ports being in communication with a reference path, and the other of said input ports being in communication with a feedback path that is coupled to said output port of said phase sensitive detector.

8. A direct conversion circuit as claimed in claim 7, wherein said reference path includes a voltage controlled oscillator and a frequency divider.

9. A direct conversion circuit as claimed in claim 7, wherein said feedback path includes a frequency divider.

10. A direct conversion circuit as claimed in claim 7, wherein said feedback path includes a second voltage controlled oscillator.

11. A direct conversion circuit as claimed in claim 1, wherein a value given by the first factor value divided by the second factor value is a second non-integer value.

12. A direct conversion circuit as claimed in claim 1, wherein the first factor value is 3 and the second factor value is 4.

13. A direct conversion receiver for receiving radio frequency signals, said receiver comprising:
    a pair of quadrature related mixers coupled to a radio frequency signal input port for mixing down radio frequency input signals residing within a first bandwidth;
    phase shift means in communication with at least one of said pair of mixers for phase shifting a local oscillator signal; and
    a local oscillator for producing said local oscillator signal, said local oscillator including a first voltage controlled oscillator for producing a first oscillator signal, and a phase locked loop including a reference path and a feedback path, at least one of said reference and feedback paths including a frequency divider for multiplying the frequency of said first oscillator signal by a first non-integer, said phase locked loop having a second bandwidth that is at least as large as the first bandwidth.

14. A direct conversion receiver as claimed in claim 13, wherein each of said reference and feedback paths includes a frequency divider.

15. A direct conversion receiver as claimed in claim 13, wherein said phase locked loop includes a second voltage controlled oscillator in said feedback path.

16. A direct conversion circuit as claimed in claim 13, wherein a value given by the inverse of the first non-integer value is a second non-integer value.

17. A direct conversion circuit as claimed in claim 13, wherein the first non-integer value is 4/3.

18. A direct conversion receiver for receiving radio frequency signals, said receiver comprising:
    a pair of quadrature related mixers coupled to a radio frequency signal input port for mixing down radio frequency input signals residing within a first bandwidth;
    phase shift means in communication with at least one of said pair of mixers for phase shifting a local oscillator signal; and
    a local oscillator for producing said local oscillator signal, said local oscillator including a first voltage controlled oscillator for producing a first oscillator signal, and a phase locked loop including a reference path and a feedback path, said reference path including a first frequency divider having a first factor value, and said feedback path including a second frequency divider having a second factor value, said local oscillator being characterized by a frequency that is defined by the frequency of said first voltage oscillator signal multiplied by a first non-integer value given by the second factor value divided by the first factor value, said phase locked loop having a second bandwidth that is at least as large as the first bandwidth.

19. A direct conversion circuit as claimed in claim 18, wherein a value given by the first factor value divided by the second factor value is also a second non-integer value.

20. A direct conversion circuit as claimed in claim 18, wherein the first factor value is 3 and the second factor value is 4.

* * * * *